US011575383B2

(12) United States Patent
Teh et al.

(10) Patent No.: US 11,575,383 B2
(45) Date of Patent: Feb. 7, 2023

(54) CLOCKING SYSTEM AND A METHOD OF CLOCK SYNCHRONIZATION

(71) Applicant: SKYECHIP SDN BHD, Bayan Lepas Pulau Pinang (MY)

(72) Inventors: Chee Hak Teh, Bayan Lepas Pulau Pinang (MY); Yu Ying Ong, Bayan Lepas Pulau Pinang (MY); Wong Ging Yeon Mark, Bayan Lepas Pulau Pinang (MY); Tat Hin Tan, Bayan Lepas Pulau Pinang (MY); Soong Khim Chew, Bayan Lepas Pulau Pinang (MY)

(73) Assignee: SKYECHIP SDN BHD, Bayan Lepas Pulau Pinang (MY)

( * ) Notice: Subject to any disclaimer, the term of this patent is extended or adjusted under 35 U.S.C. 154(b) by 0 days.

(21) Appl. No.: 17/169,425

(22) Filed: Feb. 6, 2021

(65) Prior Publication Data

US 2022/0200610 A1 Jun. 23, 2022

(30) Foreign Application Priority Data

Dec. 18, 2020 (MY) .............................. PI2020006841

(51) Int. Cl.
*H03L 7/00* (2006.01)
*H03L 7/099* (2006.01)
*H03L 7/14* (2006.01)

(52) U.S. Cl.
CPC ............ *H03L 7/0996* (2013.01); *H03L 7/143* (2013.01)

(58) Field of Classification Search
CPC ..... H03L 7/00; H03L 7/02; H03L 7/06; H03L 7/083; H03L 7/0996; H03L 7/14; H03L 7/143
See application file for complete search history.

(56) References Cited

U.S. PATENT DOCUMENTS

| 7,388,795 | B1 | 6/2008 | To et al. |
| 8,352,774 | B2 | 1/2013 | Elrabaa |
| 9,847,783 | B1 * | 12/2017 | Teh ................. H03K 19/17736 |
| 10,528,513 | B1 | 1/2020 | Chan et al. |
| 11,157,440 | B2 * | 10/2021 | Teh ........................... G06F 1/06 |

* cited by examiner

*Primary Examiner* — Hai L Nguyen

(57) ABSTRACT

A device and method of clock synchronization for external memory interface. The device, and method, generating a clock output from a phase lock loop block via a sub-module clocking component; multiplexing the clock output through a global clock into different clock domains; clocking the data and an address or a command path by each clock domain; clocking the phase compensation FIFO by clock domain and clock phase alignment clock; generating the pointer for the phase compensation FIFO from central pointer generator block; and synchronizing the pointer of the adjacent intellectual property module with a parent intellectual property module.

10 Claims, 8 Drawing Sheets

CLOCKING SYSTEM AND A METHOD OF CLOCK SYNCHRONIZATION

CROSS-REFERENCE TO RELATED APPLICATIONS

This application claims priority to Malaysian Patent Application No. PI2020006841 filed on Dec. 18, 2020, the entire contents of which are hereby incorporated by reference.

TECHNICAL FIELD

This invention relates generally to clocking system. More particularly, the present invention relates to a clocking system of an intellectual property module and the clock synchronization method to form external memory interface.

BACKGROUND ART

Advances in integrated circuit design and manufacturing have brought about significant benefits in today's electronics. Faster and denser circuits with ever increasing functionality are now feasible. Along with these positive developments, many challenges arise. The miniaturization of integrated circuits has made it feasible to place an entire system on a chip. The system on a chip designs present challenges, such as signal integrity, power distribution and dissipation, as well as clock signal distribution and synchronization. System-on-chip (SoC) designs have different intellectual property (IP) blocks that operate on independent clocks and signals crossing the clock domains could experience errors and the single clock synchronization is difficult to achieve.

U.S. Ser. No. 10/528,513 B1 discloses an integrated circuit comprises programmable resources; a plurality of hard blocks; and a programmable connector coupled to the programmable resources, the plurality of hard blocks; wherein the programmable connector is configurable to route signals between a first hard block and a second hard block in a first mode of operation and to route signals.

U.S. Pat. No. 7,388,795B1 discloses a memory controller includes a phase locked loop (PLL) to generate a differential reference clock and a first clocking component coupled to the PLL. The first clocking component includes a first delay locked loop (DLL) to receive the reference clock and to generate transmit and receive delay de-skew clock signals, a first set of phase interpolators to provide data transmit de-skewing and a first set of slave delay lines to provide data receive de-skewing.

U.S. Pat. No. 8,352,774B2 discloses an inter-clock domain data transfer FIFO circuit provides a circuit that transfers data between two clock domains of unrelated frequencies. The gate count is kept relatively low, thereby allowing data transfer between the two clock domains at one data item per cycle of the lower of the two frequencies. Depending on the frequency difference between the data producer and consumer, the initial latency could be as low as a fraction of a cycle and no more than two cycles of the consumer's clock. The operation of the data transfer FIFO circuit has been verified using gate-level simulations for several ratios of clock frequencies.

The aforementioned references may strive to provide clocking system on a functional chip. Nevertheless, they have a number of limitations and shortcomings.

For instance, the clocking system in the aforementioned references only use full-rate clocks or double frequency clocks to generate double data rate (DDR) transfers. Furthermore, the aforementioned references typically use free-running phase compensation FIFOs that requires additional logic and queues to handle backpressure at the host interface.

Accordingly, there remains a need to have an improved clocking system for supporting stitching of a plurality of intellectual property (IP) module to operate as a single wide interface on a silicon die.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide a configurable reference clock with configurable reference clock source to group the phase locked loop (PLL) of each intellectual property (IP) module into a single synchronous clock.

It is also an objective of the present invention to provide a sub-module clocking component to allow a single IP module to operate independently with different operating frequencies.

It is yet another objective of the present invention to provide a global clock distribution using a 0° and 90° phase shifted clock to allow half-rate clocks.

It is a further objective of the present invention to generate DDR transfer rates with lower power consumption.

It is also an objective of the present invention to provide a synchronous transfer in multiple IP module by the phase compensation FIFO operating in conjunction with a clock phase alignment (CPA).

Accordingly, these objectives may be achieved by following the teachings of the present invention. The present invention relates to a clocking system of an intellectual property module comprising: a phase locked loop block to generate clock output; a clock phase alignment clock connected to host interface to support periphery intellectual property clock domain stitching; characterized by a configurable reference clock comprising configurable reference clock tree and configurable reference clock source for grouping the phase locked loop block of each intellectual property module into a single synchronous clock; a sub-module clocking component for operating different operating frequencies from the reference clock; a global clock comprising 0° and 90° phase shifted clocks for receiving clock output, and 180° and 270° phase shifted clock for duty cycle correction and cycle-to-cycle correction; a configurable phase compensation FIFO comprising host interface backpressure and non-backpressure handling component; wherein the sub-module clocking component are multiplexed into different clock domains to clock data path and to clock address or command path respectively; wherein the phase compensation FIFO is clocked on one end by the multiplexed clock domain and clocked by the clock phase alignment clock; wherein the clocking system supports stitching modular periphery internet protocol blocks to form wide external memory interfaces.

The present invention also relates to a method of clock synchronization for external memory interface, characterized by the steps of: generating clock output from a phase lock loop block via a sub-module clocking component;

multiplexing the clock output generated through a global clock into different clock domains; clocking the data and address or command path by each clock domain; clocking the phase compensation FIFO by clock domain and clock phase alignment clock; generating the pointer for the phase compensation FIFO from central pointer generator block; synchronizing the pointer of the adjacent intellectual property module with parent intellectual property module.

The foregoing and other objects, features, aspects and advantages of the present invention will become better understood from a careful reading of a detailed description provided herein below with appropriate reference to the accompanying drawings.

BRIEF DESCRIPTION OF THE DRAWING

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiment of this invention and is therefore not to be considered limiting of its scope, for the invention may admit to other equally effective embodiments.

These and other features, benefits, and advantages of the present invention will become apparent by reference to the following text figure, with like reference numbers referring to like structures across the view, wherein.

DETAILED DESCRIPTION OF THE INVENTION

Figure 1:
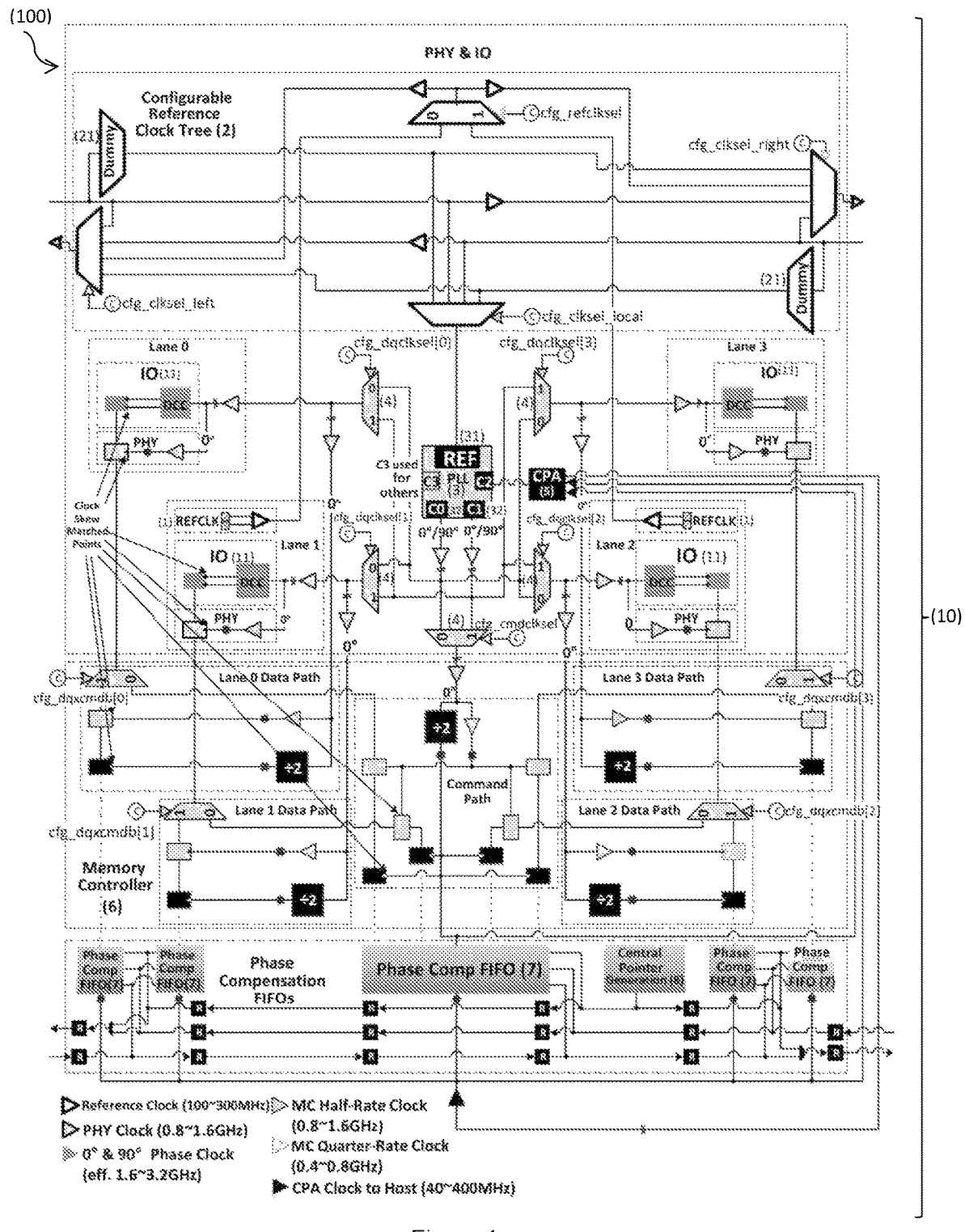
FIG. 1 shows a block diagram of a clocking system in an intellectual property (IP) module according to an embodiment of the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Referring to the drawings as shown in FIGS. 1 to 8, the invention will now be described in more details.

Referring to FIG. 1, the present invention relates to a clocking system of an intellectual property (IP) module (10) comprising: a phase locked loop (PLL) block (3) to generate a clock output; a clock phase alignment (CPA) clock (5) connected to host interface to support periphery IP clock domain stitching; characterized by a reference clock comprising configurable reference clock tree (2) and configurable reference clock source (31) for grouping the PLL (3) of each IP module (10) into a single synchronous clock; a sub-module clocking component (32) for operating different operating frequencies from the reference clock; a global clock comprising 0° and 90° phase shifted clocks for receiving clock output, and further comprising 180° and 270° phase shifted clock for duty cycle and cycle-to-cycle correction; a configurable phase compensation FIFO (7) comprising host interface backpressure and non-backpressure handling component; wherein the sub-module clocking component (32) are multiplexed into different clock domains (4) to clock data path and to clock address or command path respectively; where the phase compensation FIFO (7) is clocked on one end by the multiplexed clock domain (4) and clocked by the CPA clock (5); wherein the clocking system supports stitching modular periphery IP module (10) to form wide external memory interfaces even the IP module (10) span a distance in the silicon die.

Figure 2:
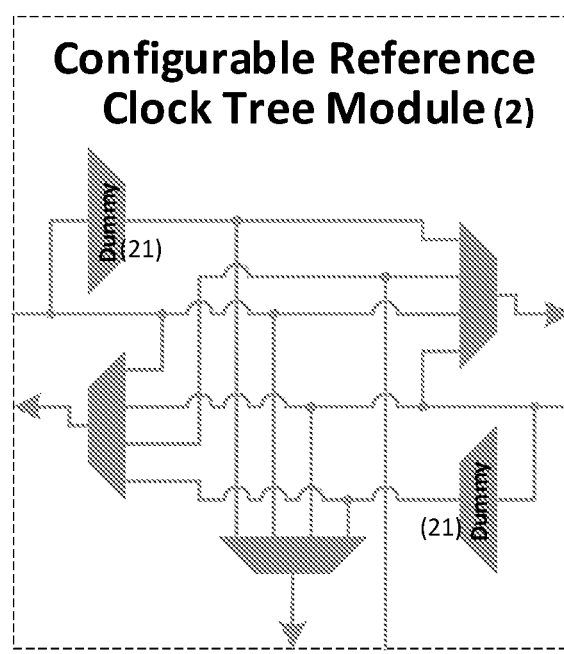
FIG. 2 shows a diagram of a configurable reference clock tree module according to an embodiment of the present invention.
Figure 3:
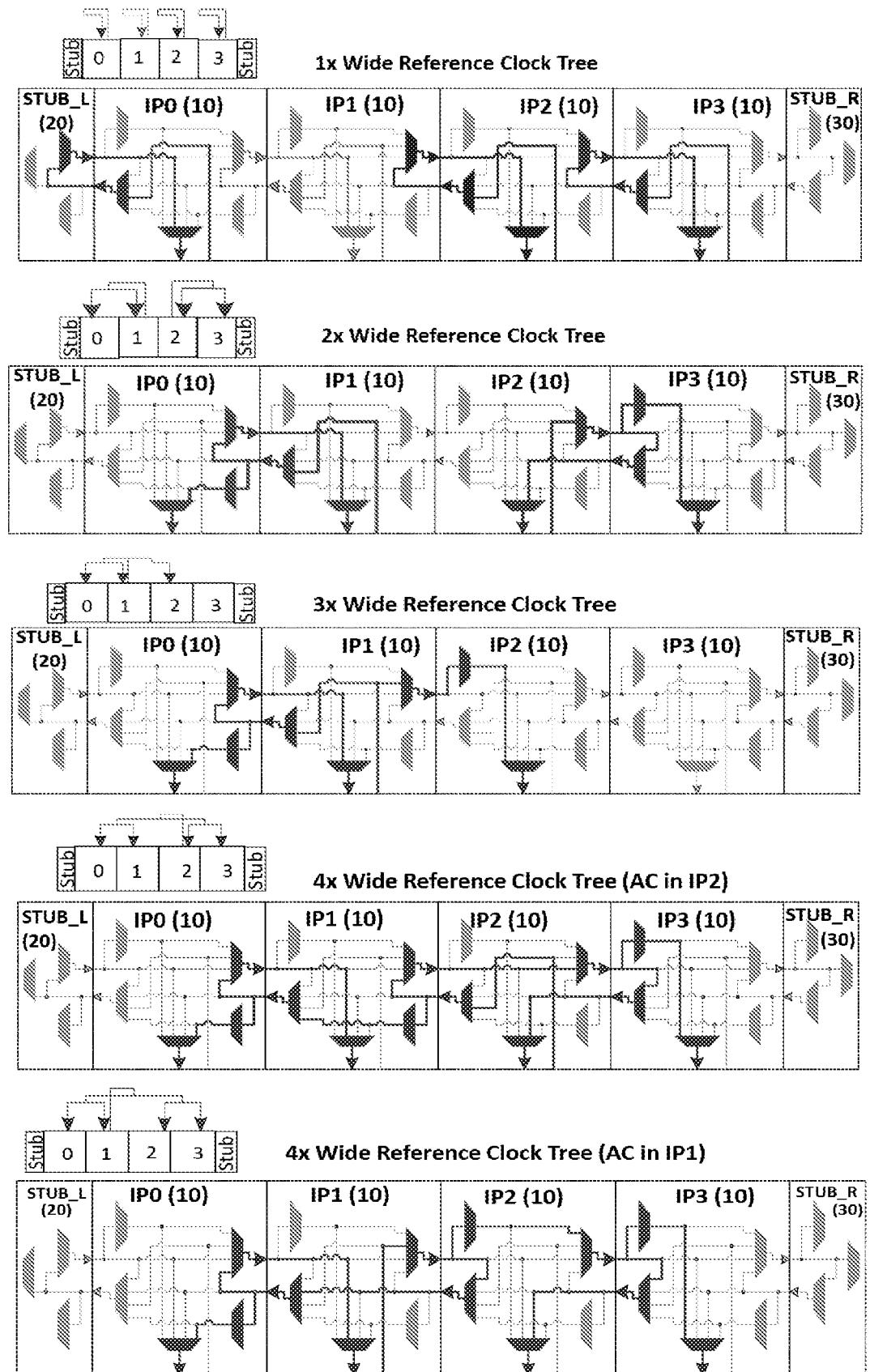
FIG. 3 shows a diagram of the balanced reference clock tree construction with the configurable reference clock tree modules according to an embodiment of the present invention.

In accordance with an embodiment of the present invention, the configurable reference clock source (31) of the PLL block (3) receive the input from the reference clock input pin (1) of the local IP module (10) or the adjacent IP module (10). The configurability for the PLL (3) to receive different input is to allow the reference clock input (1) to always be located as centre as possible with respect to the entire width of the memory interface. Additionally, the reference clock input pin (1) is also configurable to be sourced from either byte lane 1 or byte lane 2's I/O pair to provide flexibility in pin mapping when constructing the memory interfaces. This is because some command interfaces only occupy two byte lanes and so having the flexibility to map to the byte lane 0 and 1 or lane 2 and 3 for the command interface allows for the entire command pins to be moved without disrupting the reference clock tree source (2). This configurability is supply by the configurable reference clock tree module (2) as shown in FIG. 2 to allow for a variable-length balanced reference clock tree to be constructed.

In accordance with an embodiment of the present invention, the reference clock further comprising dummy multiplexers (21). The dummy multiplexers (21) are to cater for the balancing of the multiplexer stages in the clock tree (2). The number of the multiplexer stages and the clock path insertion delay is always the same from the source of the reference clock to any PLL (3) in any IP module (10) even to the IP module (10) where the reference clock input I/O resides. The reference clock may receive the input from either non-centred IP module as shown in the few examples widened reference clock tree that spans anything from a single IP module (10) all the way to multiple IP module (10) in FIG. 3. The balanced configurable reference clock tree helps to ensure that all the local PLLs (3) in each IP module (10) is relatively aligned with each other.

In accordance with an embodiment of the present invention, the PLL (3) comprising preferably but not limited to three sub-module clocking components (32) as output counters which are Counter 0 (C0), Counter 1 (C1) and Counter 2 (C2) to generate output. Each counter (32) will output preferably but not limited to four divided clock pairs consist of 0°, 90°, 180° and 270° phase shifted clocks.

More counter can be implemented to provide more clock flexibility and the example shown in FIG. 1 comprising two clock counters or the sub-module clocking components (32) to allow up to two operating frequencies per IP module (10). The two clock counters C0 and C1 are multiplex into five different clock domains (4). Four of the clock domains (4) are connected to each byte lane of the memory IP host to clock the data path and the fifth clock domain (4) is connected to memory controller (6) to clock address or command path. All the clock domains (4) will have its insertion delays matched to all destinations to allow for any clock domain (4) to communicate with other clock domain (4) synchronously.

In accordance with an embodiment of the present invention, the 0° and 90° phase shifted clock is half-rate clock distribution pairs to each byte lane. The 0° and 90° phase shifted clocks are connected to a combiner in the I/O interface (11) to generate the higher four times transfer rate to achieve a higher operating frequency. Additionally, a 180° and 270° phase shifted clock may also be supplied by the PLL (3) to facilitate clock duty cycle correction and cycle-to-cycle correction at the combiner. The 180° and 270° clocks may be routed via a shared multiplexed clock tree to its destinations.

In accordance with an embodiment of the present invention, the clock domain (4) also clocks respective phase compensation FIFO (7). Each phase compensation FIFO (7) is clocked on one end or integer divided version by the multiplexed clock domain (4) and clocked by the CPA clock (5). The CPA clock (5) serves to phase align its clock to the multiplexed command clock domain (4).

Figure 4:
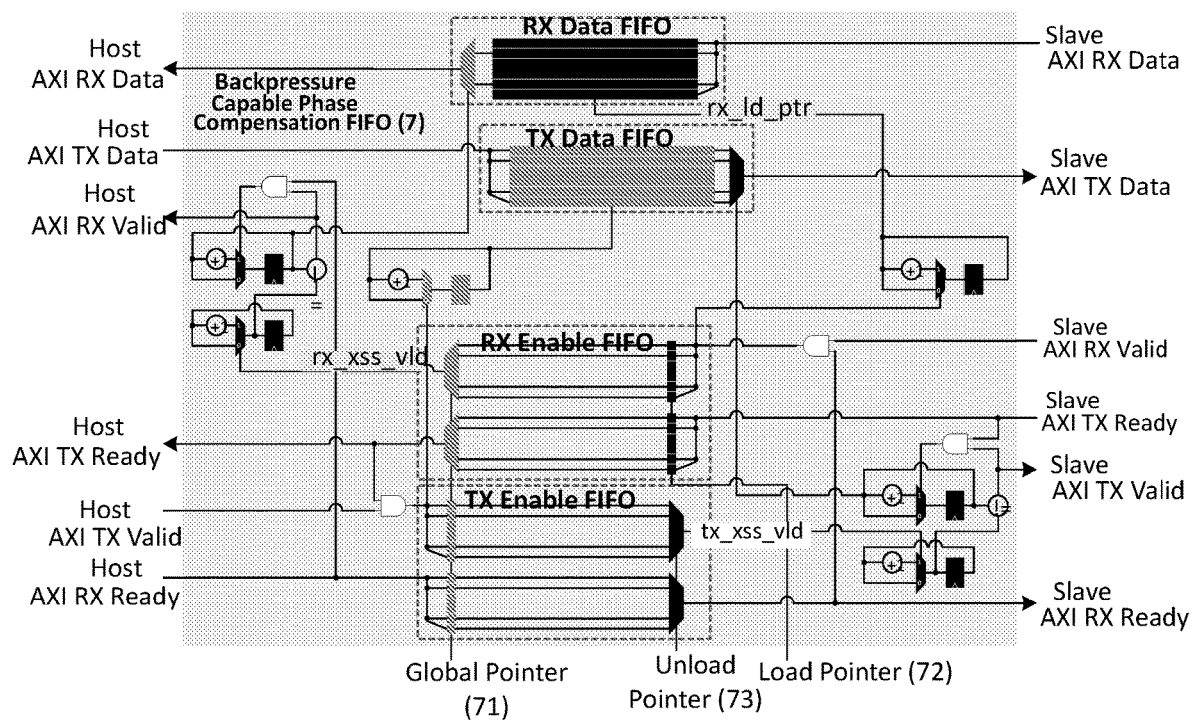
FIG. 4 shows a block diagram of the backpressure capable phase compensation FIFO according to an embodiment of the present invention.

In accordance with an embodiment of the present invention, the phase compensation FIFO (7) on the other hand is used like a sponge to absorb the high clock uncertainty created by a potentially large clock tree or high insertion delay from the wide host interface. This is achieved by configuring the phase compensation FIFO (7) to have a bigger separation between the FIFO load (72) and unload pointers (73). The phase compensation FIFO (7) is also equipped with logic to handle back-pressuring of the host interface as shown in FIG. 4. The example implementation in FIG. 4 makes use of the FIFO storage of the phase compensation FIFO (7) to temporarily store the back-pressured AXI4 interface instead of building a separate FIFO for it. This helps with reducing the amount of logic and latency needed to handle the phase compensation and back-pressuring on the host interface. The backpressure capable phase compensation FIFO (7) also supports asynchronous transfer interface to allow for asynchronous transfers over the FIFO. The backpressure capable phase compensation FIFO (7) can easily be mapped into any host interface protocols that has backpressure support such as advanced extensible interface (AXI). Phase compensation FIFO (7) also supports non-backpressure mode, which may be used for non-backpressure capable protocols like DDR PHY interface (DFI) allowing for the memory controller to be bypassed for just the memory PHY support.

Figure 5:
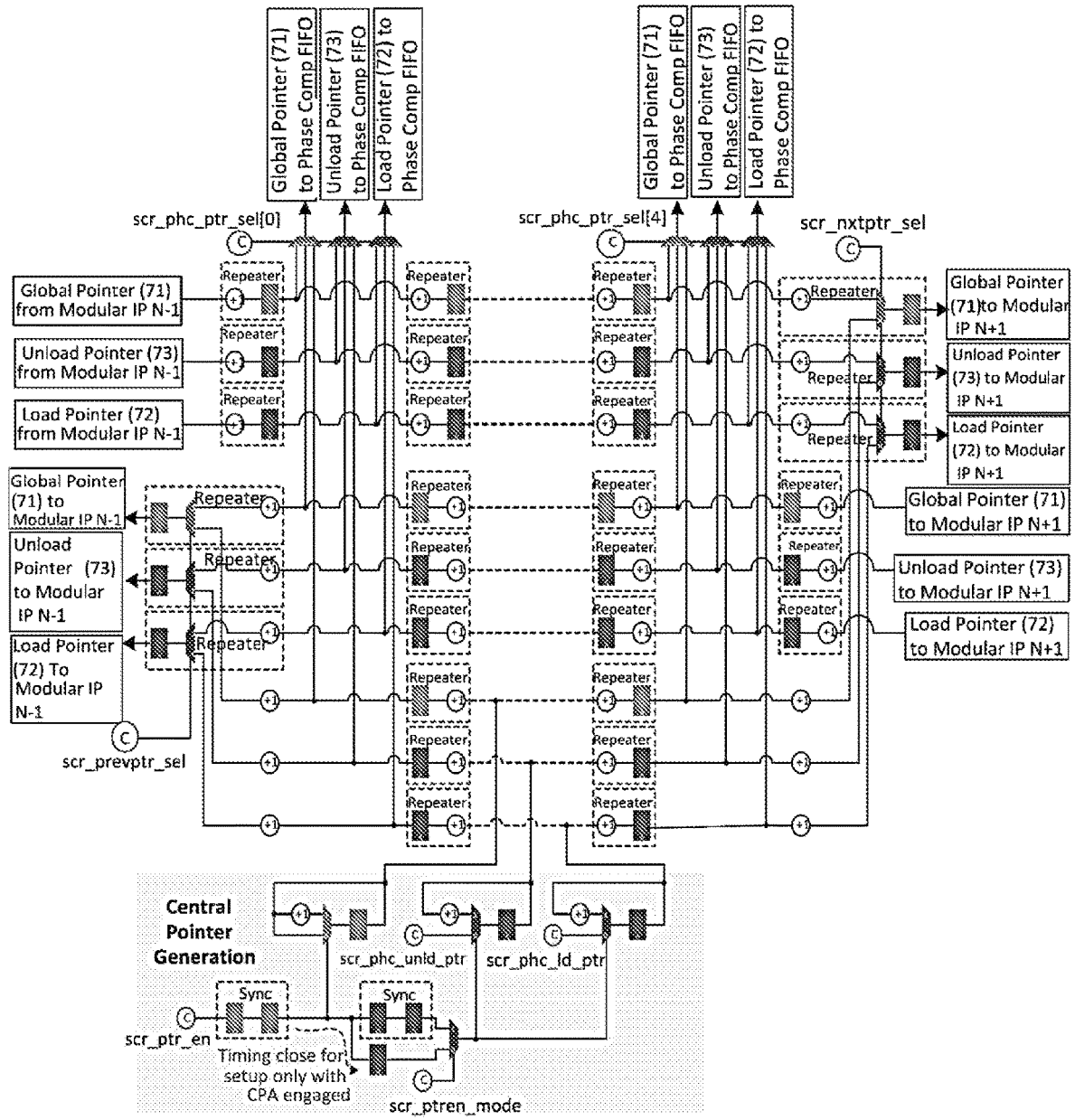
FIG. 5 shows a block diagram of a central pointer generation block for phase compensation FIFO according to an embodiment of the present invention.

Referring to FIG. 5, the phase compensation FIFO (7) further comprising central pointer generation block (8) for pointer generation. The central pointer generation block (8) further comprising global pointer (71), load pointer (72) and unload pointer (73) for sourcing from local IP module (10) or adjacent IP module (10) to ensure that all phase compensation FIFOs (7) operate in a deterministic and synchronized manner. The generated pointer can also be sent to the adjacent IP module (10) to synchronize with the pointer of the parent IP module (10) to ensure deterministic behaviour across all IP modules (10) forming the same wide memory interface.

Figure 6:
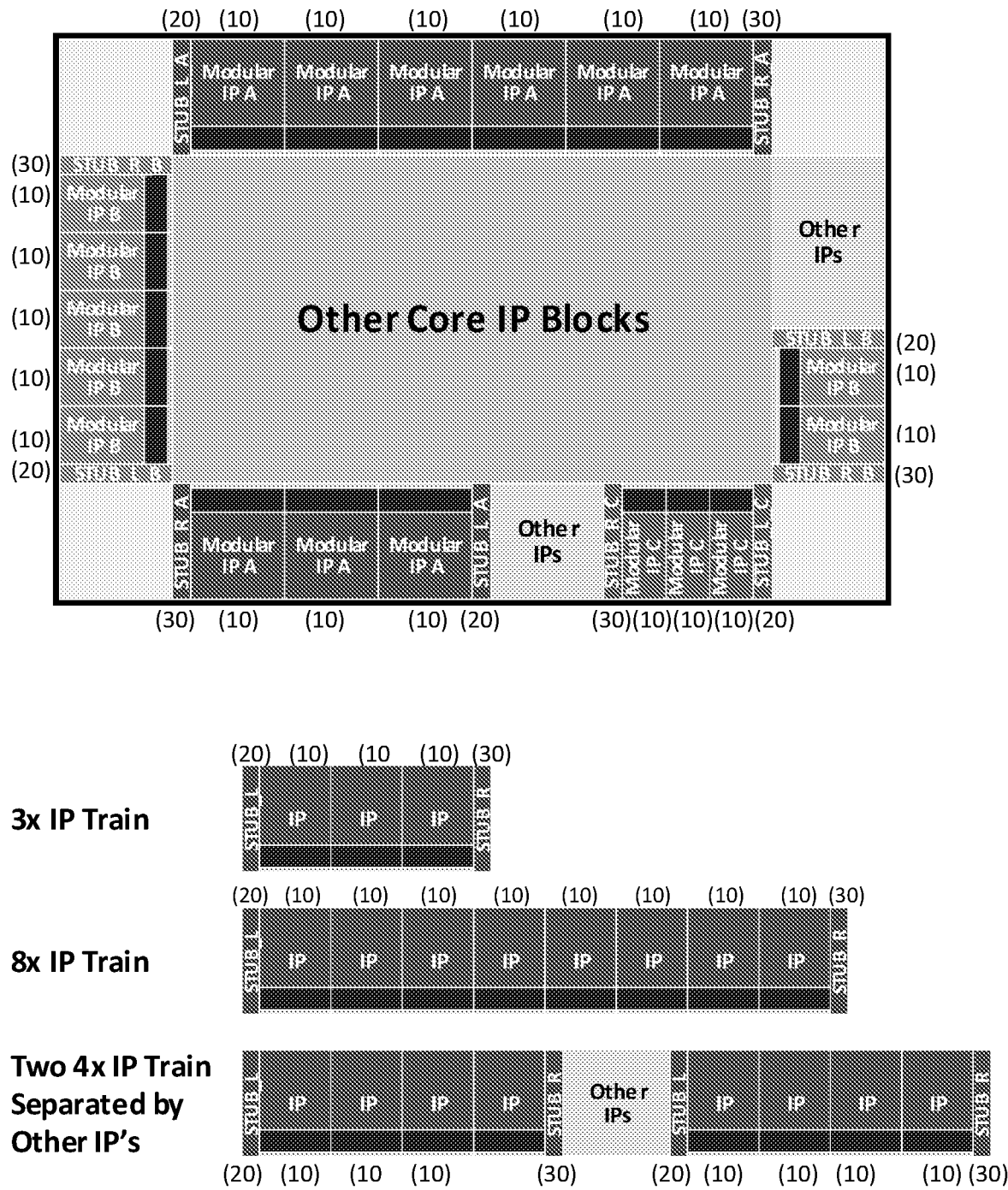
FIG. 6 shows an example of silicon die comprising modular intellectual property (IP) trains.

Referring to FIG. 6, the clocking system connects multiple IP modules (10) to form an IP train. The IP modules (10) in the train are connected by a shared clock domain (4) to operate as a single wide interface. Each type of modular IP train is terminated with a left stub "STUB L" (20) and right stub "STUB R" (30). The stubs serve to terminate any dangling inputs to the IP module (10) at the edge to provide the edge IP module (10) with a view as if it is still abutted to another instance of the same IP module (10). The different modular IP trains using the clocking system (100) can be deployed on a single die and even on the same periphery edge as long as it is terminated by its respective stubs.

Figure 7:
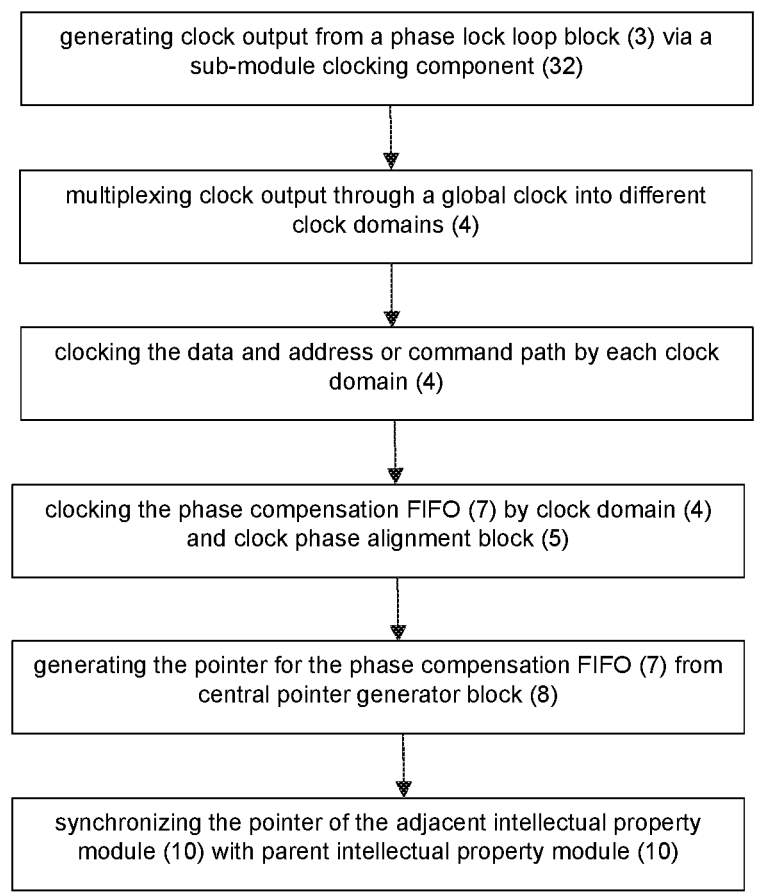
FIG. 7 shows a flow chat of the method of clock synchronization for external memory interface according to an embodiment of the present invention.

Referring to FIG. 7, the present invention also related to a method (200) of clock synchronization for external memory interface, characterized by the steps of generating output from a PLL block (3) via a sub-module clocking component (32); multiplexing clock output generated through a global clock into different clock domains (4); clocking the data and address or command path by each clock domain (4); clocking the phase compensation FIFO (7) by clock domain (4) and CPA clock (5); generating the pointer for the phase compensation FIFO (7) from central pointer generator block (8); synchronizing the pointer of the adjacent IP module (10) with parent IP module (10).

Hereinafter, examples of the present invention will be provided for more detailed explanation. It will be understood that the examples described below are not intended to limit the scope of the present invention.

Example

An IP module (10) that is shared across two memory interfaces will have different operating frequencies. The local PLL (3) will be configured to output the two different operating frequencies from the respective C0 and C1 outputs and the multiplexers for the address or command path and data path will be configured accordingly to allow the individual address or command and data path to operate at the desired operating frequencies. The control of the phase compensation FIFO (7) will then either be configured to source from the local central pointer generation block (8) if the address or command of the memory interface is mapped into the local IP module (10) while the data path that is shared with an adjacent IP module (10) where the address or command for that interface resides will have its pointers sourced from the adjacent IP module (10).

Figure 8:
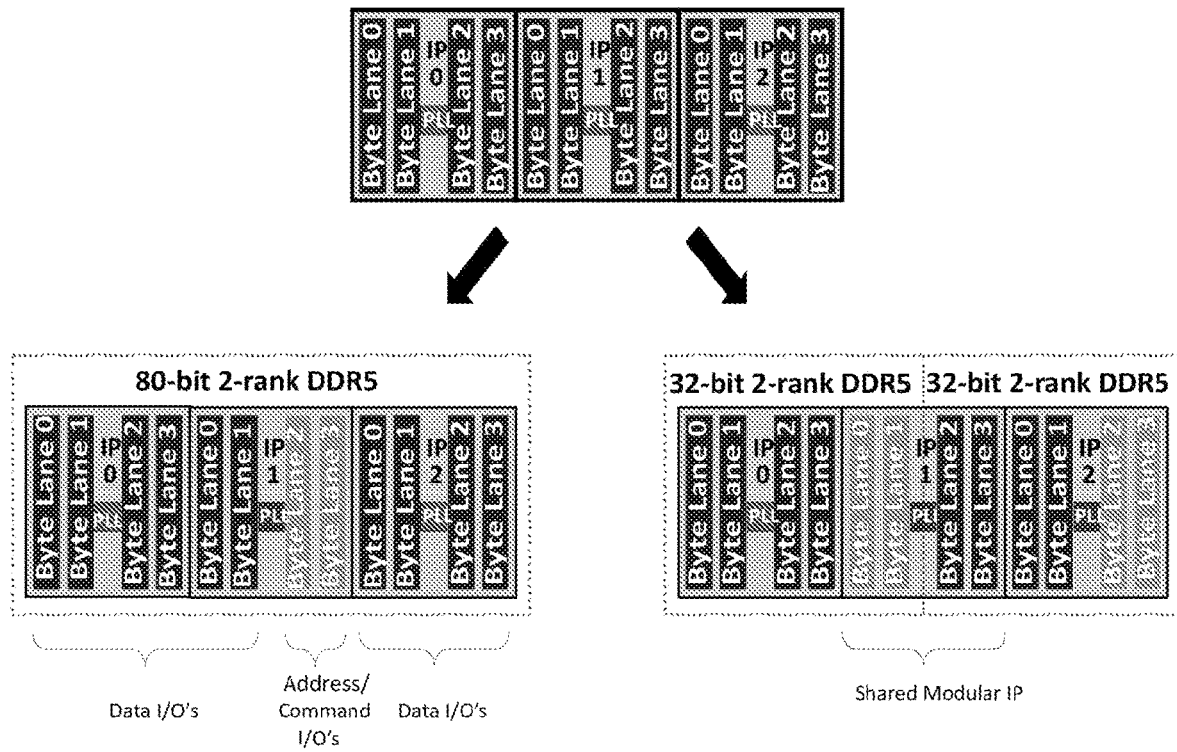
FIG. 8 shows an example of modular periphery memory IP train configurations according to an embodiment of the present invention.

The clocking system (100) in the present invention allows different IP module (10) in the same train to operate as a single wide interface using a shared clock domain (4). For example, an IP module (10) with 54 I/O's organized into byte lanes of either 14 I/O's or 13 I/O's each may comprise sufficient IO's to build a narrow 16-bit 2-rank DDR5 interface which is the I/O's needed for the address or command and data path and will require more similar IP module (10) to construct a 80-bit 2 rank DDR5 interface. Under such conditions, three adjacent IP module (10) will need to be stitched together to form the wider 80-bit 2-rank DDR5 interface as shown in FIG. 8. The same train of three IP module (10) could also fit two 32-bit 2-rank DDR5 interfaces but it would require that some IP module (10) share the clock source and configuration resources across adjacent IP module (10).

The exemplary implementation described above is illustrated with specific characteristics, but the scope of the invention includes various other characteristics.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

It is to be understood that any prior art publication referred to herein does not constitute an admission that the publication forms part of the common general knowledge in the art.

The invention claimed is:

1. A clocking system of an intellectual property module, the clocking system comprising:
    a phase locked loop block to generate a clock output;
    a clock phase alignment clock connected to a host interface to support periphery intellectual property clock domain stitching;
    a configurable reference clock including a configurable reference clock tree and a configurable reference clock source for grouping the phase locked loop block of each intellectual property module into a single synchronous clock;
    a sub-module clocking component connected to the phase locked loop block for operating different operating frequencies from the reference clock;
    a global clock comprising:
        a 0° phase shifted clock for receiving clock output;
        a 90° phase shifted clock for receiving clock output;
        a 180° phase shifted clock for duty cycle correction and cycle-to-cycle correction; and
        a 270° phase shifted clock for duty cycle correction and cycle-to-cycle correction; and
    a configurable phase compensation FIFO including a host interface backpressure and a non-backpressure handling component, wherein
    said sub-module clocking component are multiplexed into different clock domains to clock data path and to a clock address or a command path respectively;
    said phase compensation FIFO is clocked on one end by the multiplexed clock domain and clocked by the clock phase alignment clock; and
    said clocking system supports stitching modular periphery intellectual property blocks to form wide external memory interfaces.

2. The clocking system of claim 1, wherein the configurable reference clock source receives the input from the local intellectual property module or the adjacent intellectual property module.

3. The clocking system of claim 1, wherein the configurable reference clock further comprising dummy multiplexers.

4. The clocking system of claim 1, wherein the 0°, 90°, 180° and 270° phase shifted clock is half-rate clock distribution pairs to each byte lane.

5. The clocking system of claim 1, wherein the phase compensation FIFO further including a central pointer generation block for pointer generation.

6. The clocking system of claim 5, wherein the central pointer generation block further including a global pointer, a load pointer and an unload pointer for sourcing from a local intellectual property module or an adjacent intellectual property module.

7. The clocking system of claim 1, wherein the 0°, 90°, 180° and 270° phase shifted clocks are connected to a combiner in each I/O interface.

8. The clocking system of claim 1, wherein each clock domain clocks respective phase compensation FIFO.

9. The clocking system of claim 1, wherein each of the clock domains has insertion delays match for communicating with the other clock domains synchronously.

10. The clocking system of claim 9, wherein the clock domains connect to each byte lane of the memory intellectual property host to clock data path and connect to memory controller to clock address or command path.

* * * * *